United States Patent
Miyata

(10) Patent No.: US 11,422,171 B2
(45) Date of Patent: Aug. 23, 2022

(54) METHOD FOR CALCULATING POWER SUPPLY VOLTAGE WAVEFORM, METHOD FOR ANALYZING CIRCUIT COUPLED MAGNETIC FIELD, PROGRAM AND RECORDING MEDIUM RECORDING PROGRAM

(71) Applicant: Hitachi, Ltd., Tokyo (JP)

(72) Inventor: Kenji Miyata, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 122 days.

(21) Appl. No.: 16/649,731

(22) PCT Filed: Sep. 21, 2018

(86) PCT No.: PCT/JP2018/035019
§ 371 (c)(1),
(2) Date: Mar. 23, 2020

(87) PCT Pub. No.: WO2019/130685
PCT Pub. Date: Jul. 4, 2019

(65) Prior Publication Data
US 2020/0256900 A1  Aug. 13, 2020

(30) Foreign Application Priority Data

Dec. 28, 2017 (JP) .............................. JP2017-252916

(51) Int. Cl.
*G01R 19/25* (2006.01)
*G01R 13/02* (2006.01)
*G01R 15/18* (2006.01)

(52) U.S. Cl.
CPC ......... *G01R 19/2513* (2013.01); *G01R 13/02* (2013.01); *G01R 15/181* (2013.01)

(58) Field of Classification Search
CPC .. G01R 13/02; G01R 15/181; G01R 19/2513; G06F 30/367; G06F 30/23
See application file for complete search history.

(56) References Cited

U.S. PATENT DOCUMENTS

2009/0116268 A1* 5/2009 Kishida .................. H02M 1/12
363/68
2009/0322264 A1* 12/2009 Imura ................. H02P 21/0089
318/400.09

(Continued)

FOREIGN PATENT DOCUMENTS

| JP | 2016-3971 A | | 1/2016 |
| JP | 2016003971 A | * | 1/2016 |
| WO | WO-2014115640 A1 | * | 7/2014 | ............. G06F 30/20 |

OTHER PUBLICATIONS

International Search Report, dated Dec. 18, 2018, which issued during the prosecution of International Application No. PCT/JP2018/035019, which corresponds to the present application.

(Continued)

*Primary Examiner* — Michael J Dalbo
(74) *Attorney, Agent, or Firm* — Baker Botts L.L.P.

(57) ABSTRACT

In the present invention, in an electromagnetic device that uses a coil current, such as a motor, an initial value of a desired coil current waveform is inputted, a magnetic field analysis is performed for the electromagnetic device, a power supply voltage waveform which is derived from a magnetic vector potential acquired from the analysis is calculated, and a circuit coupled magnetic field analysis is performed by using a fundamental waveform component of the calculated power supply voltage waveform, thereby providing a power supply voltage waveform calculation method and a circuit coupled magnetic field analysis method for obtaining a steady solution more quickly than in the conventional technique.

6 Claims, 10 Drawing Sheets

(56) References Cited

U.S. PATENT DOCUMENTS

2011/0144959 A1* 6/2011 Miyata .................... G06F 17/13
                                                       703/2
2016/0373033 A1* 12/2016 Suzuki ...................... H02P 7/04
2017/0244350 A1* 8/2017 Price ......................... H02P 6/10

OTHER PUBLICATIONS

Norio Takahashi, "Finite Element Method of Magnetic Engineering" Asakura Publishing (2013) pp. 251-253 (Partial English translation attached).

Tadashi Tokumasu, et al., "Problems remained in high precision electromagnetic analyses: review on convergence acceleration of time-periodic problems," IEICE Technical Report, Aug. 31, 2016, vol. 116, No. 212, pp. 133-138, column line 10 (English translation of abstract attached).

* cited by examiner

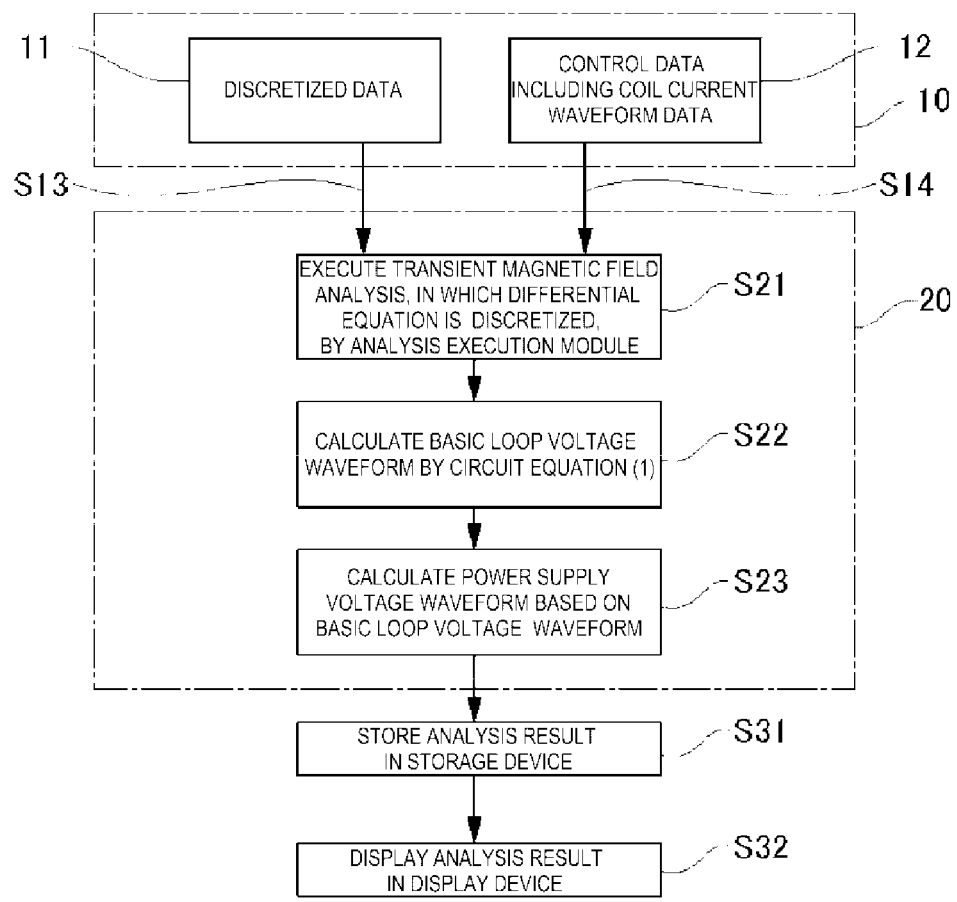

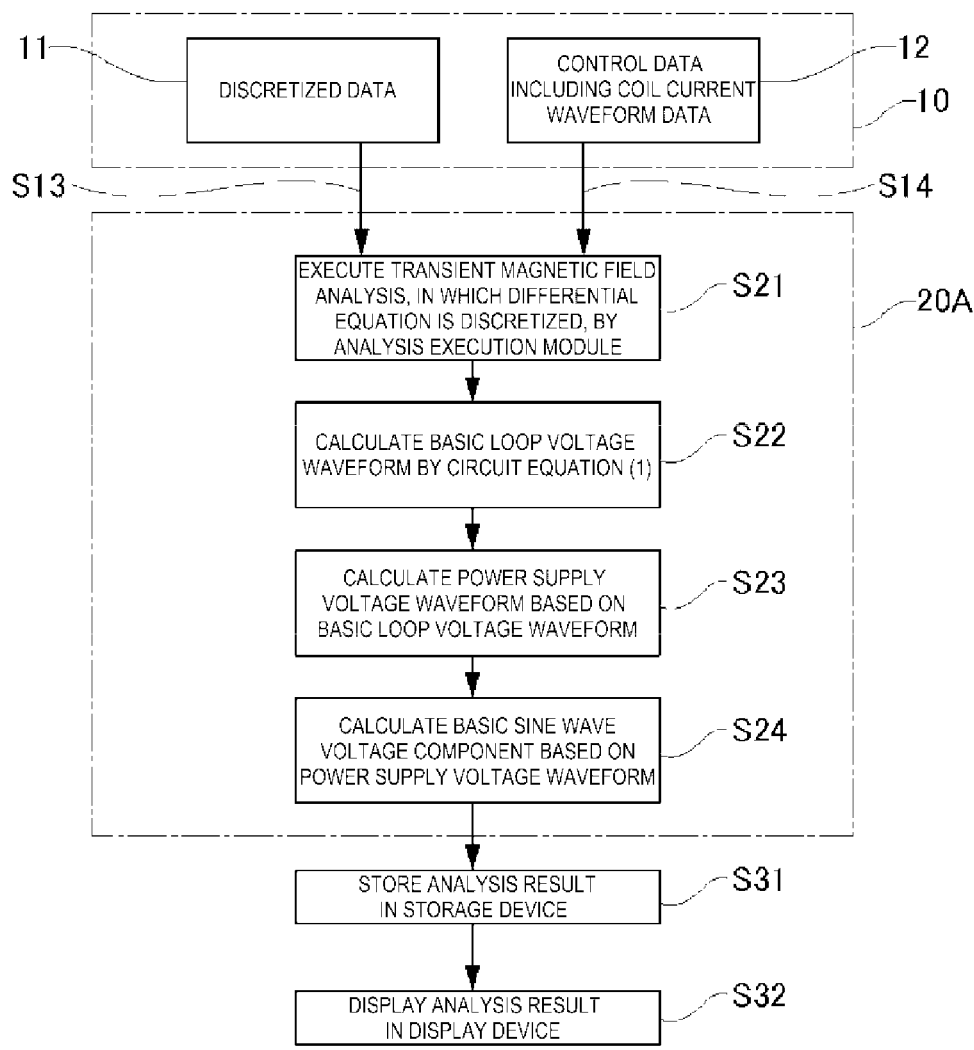

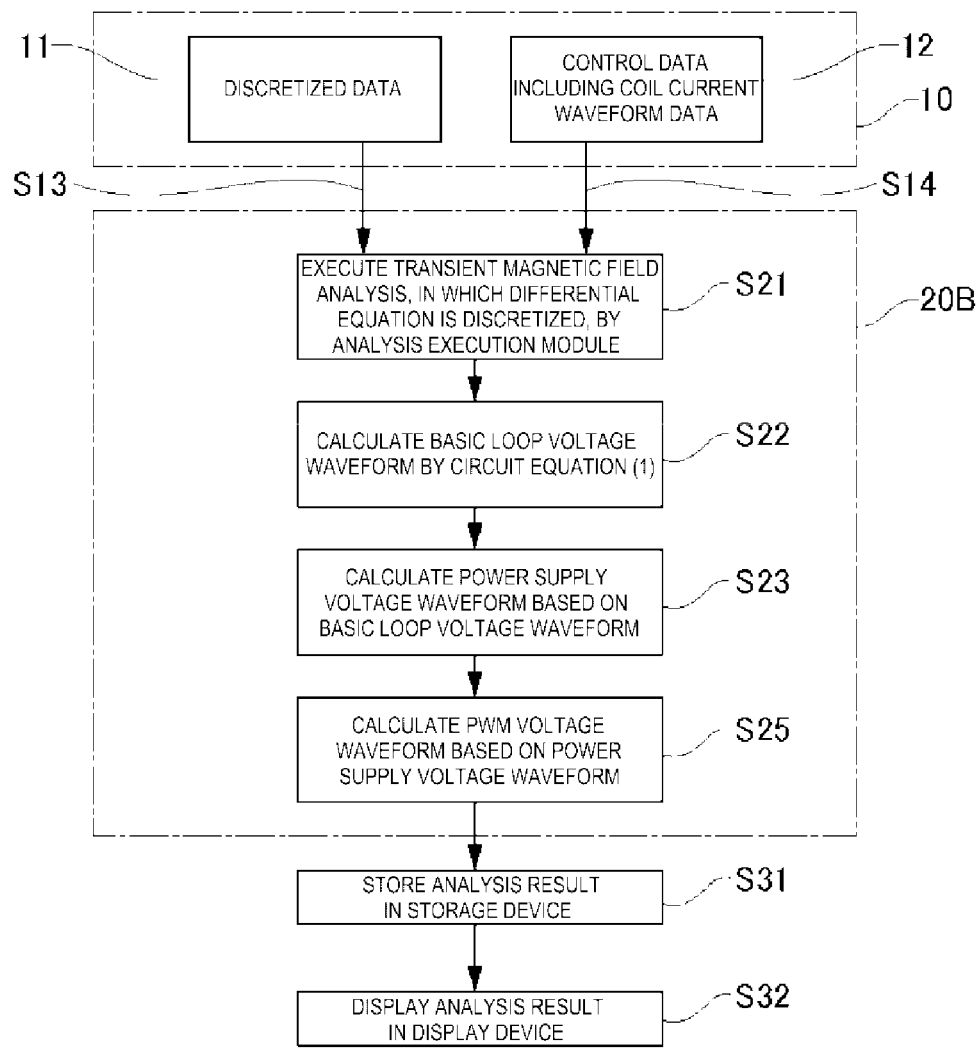

[FIG. 4]
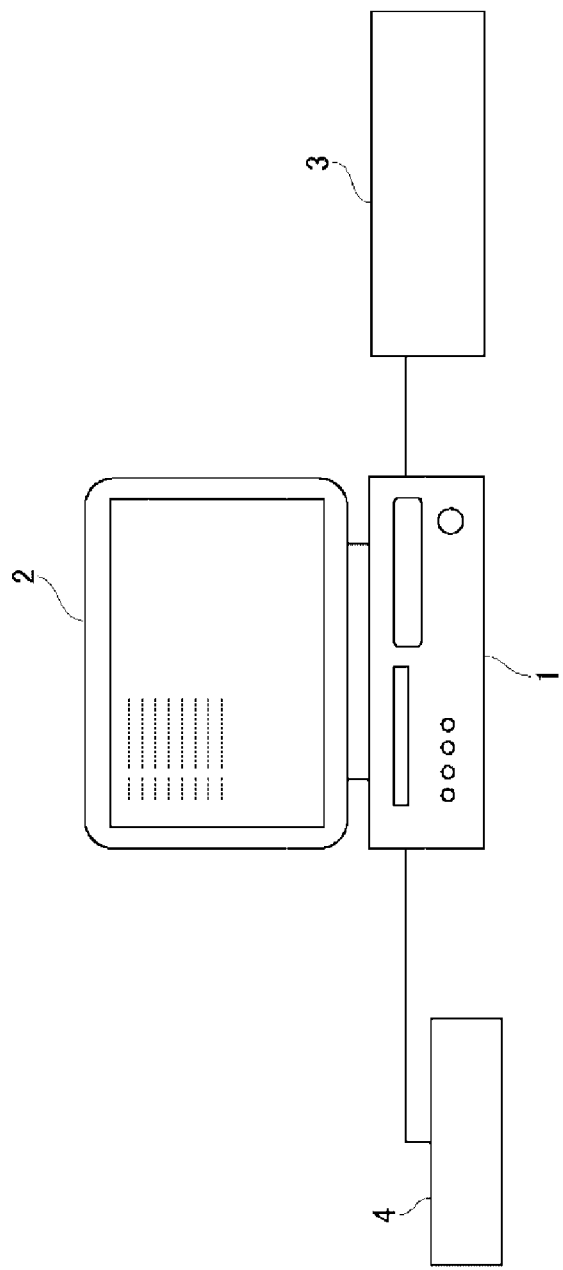

[FIG. 5]
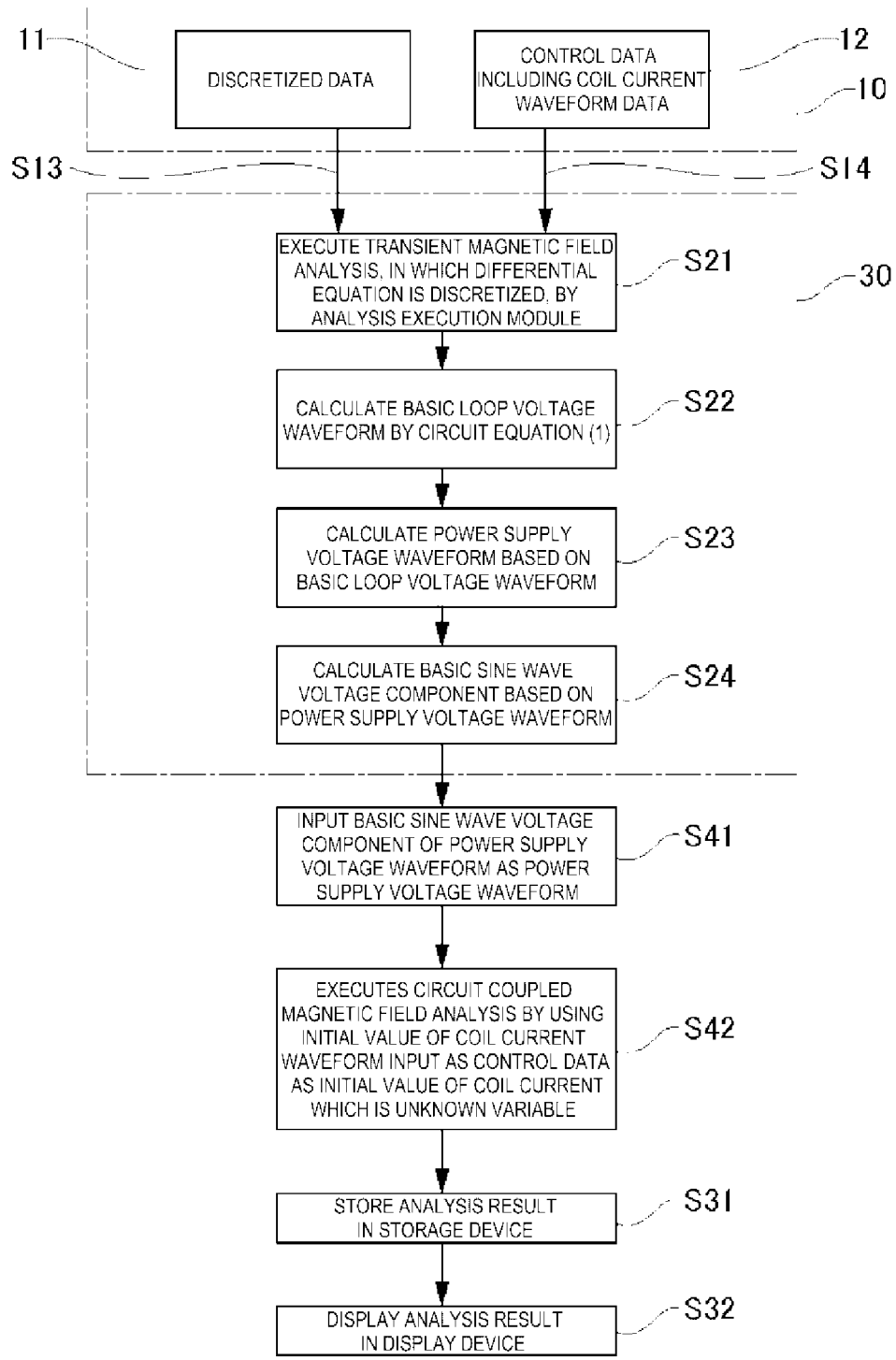

[FIG. 6]
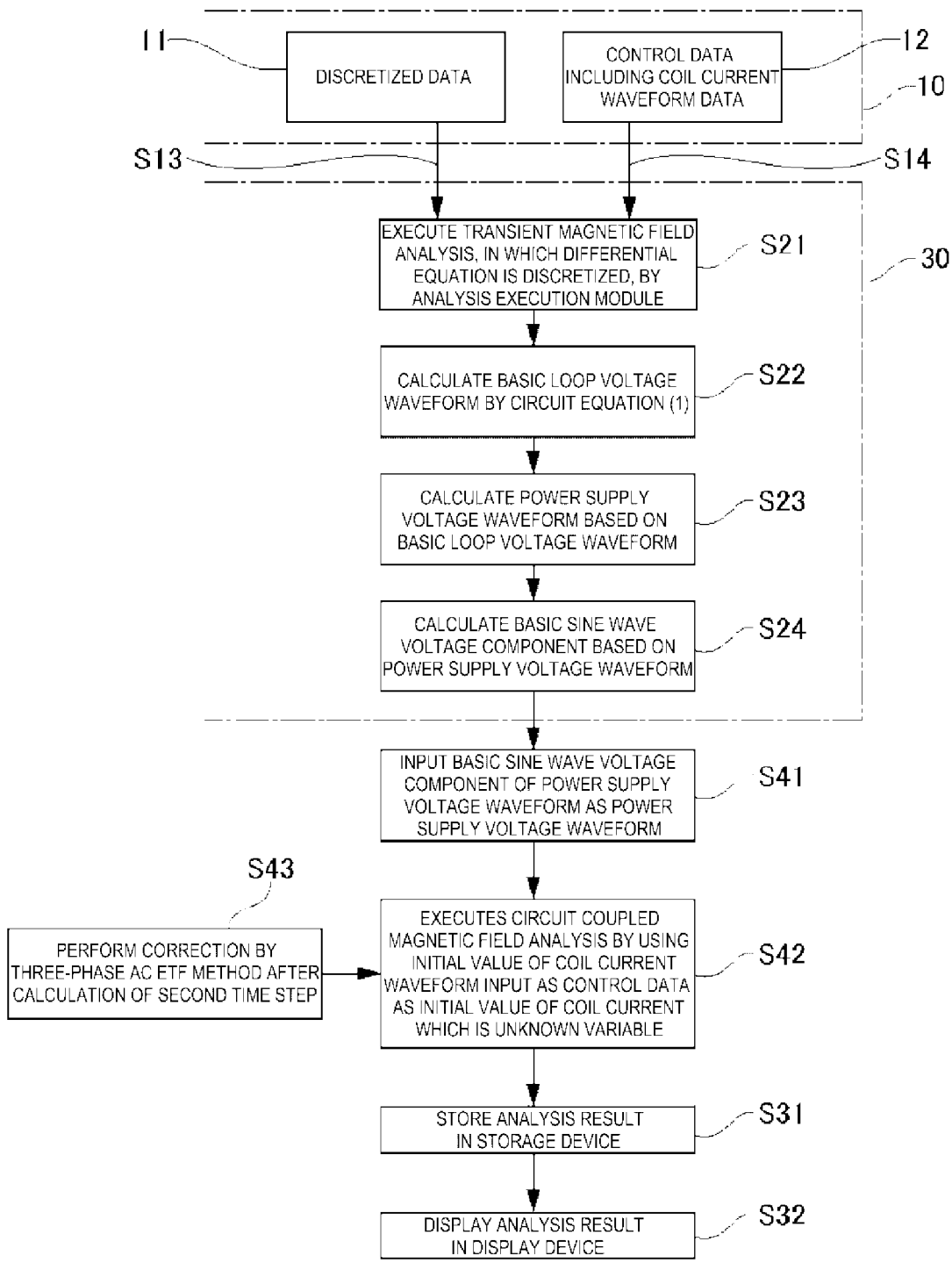

[FIG. 7]
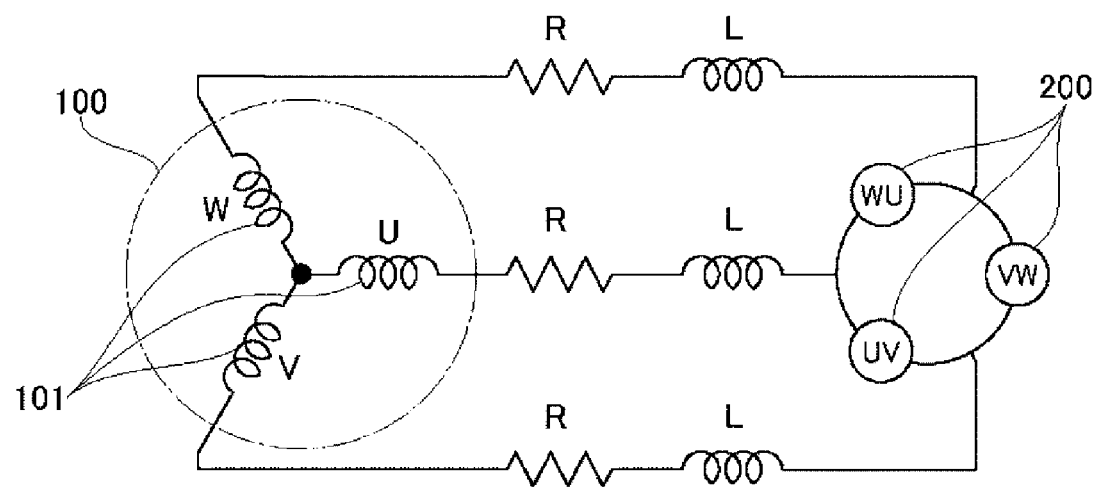

[FIG. 8]

VOLTAGE WAVEFORM OF THREE-PHASE AC POWER SUPPLY

A CASE WHERE INITIAL VALUE OF ORIGINAL COIL CURRENT
WAVEFORM IS NOT USED AND CORRECTION IS NOT PERFORMED

A CASE WHERE INITIAL VALUE OF ORIGINAL COIL CURRENT WAVEFORM
IS NOT USED AND CORRECTION IS PERFORMED THREE TIMES EVERY
ELECTRICAL ANGLE OF 60° BY THREE-PHASE AC SIMPLIFIED TP-EEC METHOD

[FIG. 9]

ORIGINAL COIL CURRENT WAVEFORM

POWER SUPPLY VOLTAGE WAVEFORM
OBTAINED FROM ORIGINAL COIL CURRENT

BASIC WAVE COMPONENT OF POWER SUPPLY VOLTAGE WAVEFORM

PERFORMING CORRECTION ONCE
ACCORDING TO THREE-PHASE AC ETF METHOD

[FIG. 10]

METHOD FOR CALCULATING POWER SUPPLY VOLTAGE WAVEFORM, METHOD FOR ANALYZING CIRCUIT COUPLED MAGNETIC FIELD, PROGRAM AND RECORDING MEDIUM RECORDING PROGRAM

TECHNICAL FIELD

The present invention relates to a method for calculating a power supply voltage waveform, a method for analyzing a circuit coupled magnetic field, a program for executing these methods, and a recording medium recording the program.

BACKGROUND ART

In related art, there are a magnet and a coil current as a magnetic field source for driving an electromagnetic device such as a motor. In order to enable the electromagnetic device to perform a predetermined operation, it is desired that a coil current waveform is made to flow as designed. Generally, in a circuit coupled magnetic field analysis in which the electromagnetic device and a power supply circuit for driving the electromagnetic device are combined, a power supply voltage waveform is input, and an analysis is executed using a quantity related to a magnetic vector potential describing a magnetic field and a coil current as unknown variables.

In this case, amplitude and a phase of the power supply voltage waveform are adjusted to obtain a desired coil current waveform. However, this requires performing several times of trials and errors. In addition, since a coil current waveform is unknown even for one calculation, a long calculation time is required to obtain a steady coil current waveform. In general, transient analysis of about one hundred to several hundred steps is required to reach a steady-state solution, so that a three-dimensional analysis may require a calculation time of several days.

In order to assist this, there is a method in which a coil induced voltage waveform is calculated by a backward difference of an average magnetic vector potential based on a magnetic field analysis in which a desired coil current waveform is input, and a coil line voltage waveform is calculated by a winding resistor and a coil current (See Non-Patent Literature 1).

CITATION LIST

Prior Art Document

Non-Patent Literature 1: Norio Takahashi "Finite Element Method of Magnetic Engineering" Asakura Publishing (2013) pp. 251-253

SUMMARY OF INVENTION

Technical Problem

However, according to the method of related art described in Non-Patent Document 1, only a calculation of the coil line voltage waveform with the input of the desired coil current waveform is performed, and the calculation of the power supply voltage waveform is not completed.

In addition, as a method of accelerating convergence to a steady field, a method such as a time periodic-explicit error correction (TP-EEC) method or a simplified TP-EEC method is known, but even if this method is used, there is a problem that it takes a certain amount of time to reach the steady field because a transient analysis in a certain time step is required to obtain a target steady field.

An object of the invention is to provide a method for calculating a power supply voltage waveform so as to solve a first problem that it is necessary to perform circuit coupled magnetic field analysis by inputting a power supply voltage waveform several times by trial and error to obtain a desired coil current waveform. Another object of the invention is to provide a method for analyzing a circuit coupled magnetic field so as to solve a second problem that it takes certain time to obtain a steady-state solution of a coil current waveform after a power supply voltage waveform is finally determined. The invention provides a program related to the above-mentioned two methods and a recording medium storing the program.

Solution to Problem

In order to solve the above problems, for example, configurations described in the claims are adopted.

The invention includes a plurality of solution for solving the above problems, for example, a method for calculating a power supply voltage waveform according to the invention includes the following steps (a) to (d).
(a) A step of reading, into a computer, input data including discretized data for numerically solving a differential equation, and control data for controlling an analysis process in which coil current waveform data is included;
(b) a step of performing a transient magnetic field analysis in which the coil current waveform data is taken as a given condition by using the input data;
(c) a step of calculating a basic loop voltage waveform in a power supply unit based on "a coil induced voltage waveform obtained in the step of performing the transient magnetic field analysis" and "the coil current waveform data used as the input data" by using a circuit equation in a power supply circuit; and
(d) a step of calculating a power supply voltage waveform based on the basic loop voltage waveform.

Further, a method for analyzing a circuit coupled magnetic field according to the invention includes the following (e) to (g) in addition to the above steps (a) to (d).
(e) A step of calculating a basic sine wave voltage component based on the power supply voltage waveform;
(f) a step of inputting the basic sine wave voltage component as a power supply voltage waveform; and
(g) a step of performing a circuit coupled magnetic field analysis by using an initial value of the coil current waveform input as the control data as an initial value of a coil current which is an unknown variable.

Advantageous Effect

According to the method for calculating the power supply voltage waveform of the invention, a power supply voltage waveform for implementing a desired coil current waveform can be directly calculated. Further, since the above-described steps (a) to (d) are certainly performed in a motor design process, when the power supply voltage waveform is determined, substantially only the above-described steps (e) to (g) need to be performed, and thus, a final coil current waveform can be obtained. Therefore, according to the method for analyzing the circuit coupled magnetic field of the invention, there is an effect that an analysis time spent on the circuit coupled magnetic field analysis can be reduced. As a result, it is possible to reduce the cost and shorten a period of design and development for designing and developing electric equipment such as a motor.

Problems, configurations, and effects other than those described above will be clarified by descriptions of the following embodiments.

BRIEF DESCRIPTION OF DRAWINGS

FIG. 1 is a flowchart illustrating a first embodiment of the invention.

FIG. 2 is a flowchart illustrating a second embodiment of the invention.

FIG. 3 is a flowchart illustrating a third embodiment of the invention.

FIG. 4 is a schematic configuration diagram of a device for mounting the invention.

FIG. 5 is a flowchart illustrating a fourth embodiment of the invention.

FIG. 6 is a flowchart illustrating a fifth embodiment of the invention.

FIG. 7 is a diagram illustrating a relationship between a power supply and a coil of a synchronous motor indicating an analysis target in the first to fifth embodiments of the invention.

DESCRIPTION OF EMBODIMENTS

First, before describing first to fifth embodiments of the invention respectively illustrated in FIGS. 1 to 3 and FIGS. 5 and 6, a mathematical basis for solving the problem of the invention is compared with a method of related art. This will be described with reference to FIGS. 7 to 9.

<Description of Method for Analyzing Circuit Coupled Magnetic Field of Related Art>

FIG. 7 illustrates a motor coil 101 of a magnetic field analysis region 100 including asynchronous motor, and a power supply circuit 200 connected to the motor coil 101.

As illustrated in FIG. 7, the motor coil 101 (U, V, W) of the magnetic field analysis region 100 including the synchronous motor is connected to the three-phase AC power supply 200 (UV, VW, WU) respectively via resistors R and inductances L.

A first object is to quickly obtain a power supply voltage waveform for implementing a coil current waveform that is appropriate in design in the motor coil 101.

The coil current waveform flowing through the motor coil 101 is determined from a viewpoint of optimizing operation characteristics of the motor, but at this time, what kind of power supply voltage waveform should be supplied is not known in advance. Therefore, in the method of the related art, a user adopts methods such as a three-phase AC TP-EEC method or a three-phase AC simplified TP-EEC method, so that a steady coil current waveform is quickly obtained by temporarily setting a power supply voltage waveform of the three-phase AC power supply.

Figure 8A:
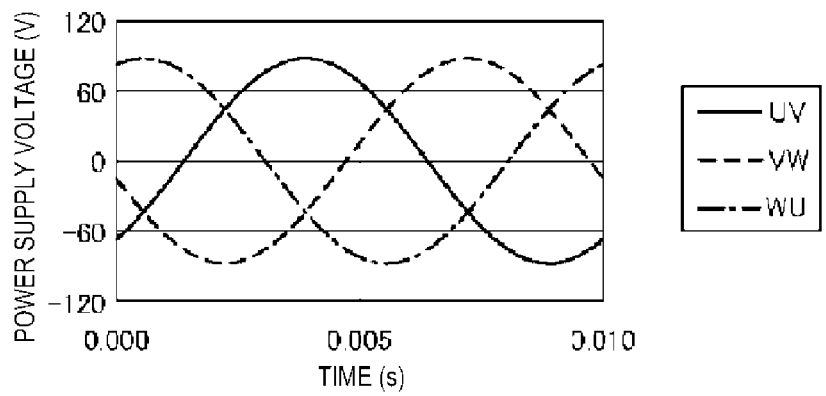
FIG. 8 is a waveform chart illustrating procedures for stabilizing a coil current waveform from a power supply waveform in a method of related art.
Figure 8B:
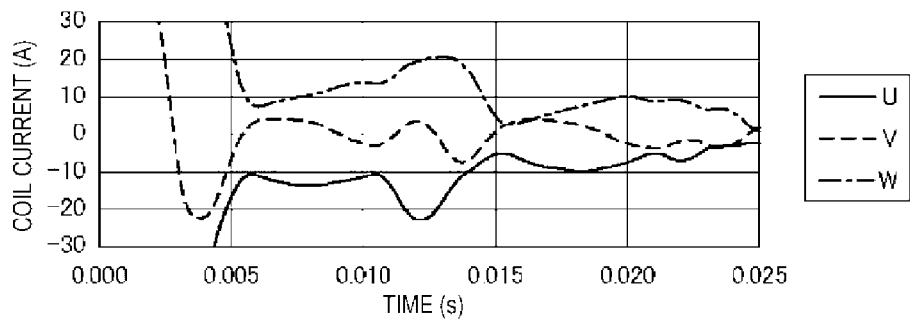

FIG. 8 is a diagram illustrating the method of the related art for obtaining the coil current waveform by using the three-phase AC TP-EEC method. As illustrated in FIG. 8A, the method of the related art is based on the voltage waveform of the three-phase AC power supply. FIG. 8B illustrates coil current waveforms when the power supply 200 applies the voltage waveform of the three-phase AC power supply illustrated in FIG. 8A, and correction is not performed by the three-phase AC simplified TP-EEC method.

Figure 8C:
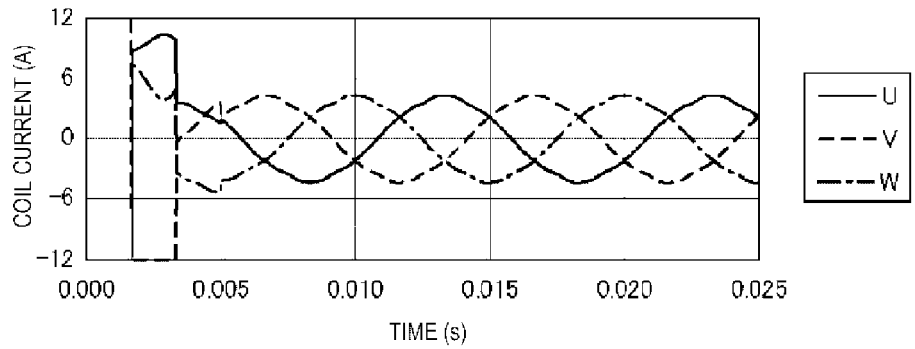

In contrast, FIG. 8C illustrates coil current waveforms when the correction is performed three times by a time interval corresponding an electrical angle of 60° by the three-phase AC simplified TP-EEC method in a circuit coupled transient magnetic field analysis based on the voltage waveform of the three-phase AC power supply.

In FIG. 8B, since the correction is not performed by the three-phase AC simplified TP-EEC method, the coil current waveform of the motor coil 101 does not reach a steady state even after 25 ms. However, as illustrated in FIG. 8C, when the correction is performed three times by the three-phase AC simplified TP-EEC method, it can be seen that the coil current waveform almost reaches the steady state after 5 ms. In FIG. 8C, the coil current waveform changes discontinuously at three time points until 5 ms, and the three places of this discontinuous change points correspond to the three corrections performed by the three-phase AC simplified TP-EEC method.

<Description of Method for Analyzing Circuit Coupled Magnetic Field of Invention>

Figure 9A:
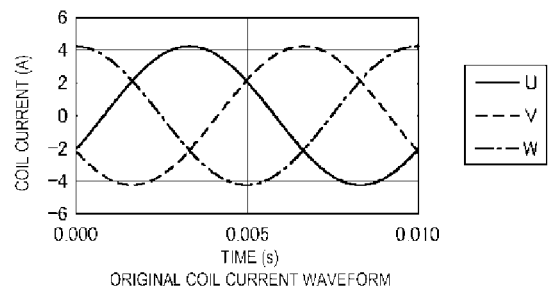
FIG. 9 is a waveform chart illustrating procedures for obtaining a coil current waveform stabilized with a small number of corrections from a circuit coupled magnetic field analysis using a method of the present invention.
Figure 9B:
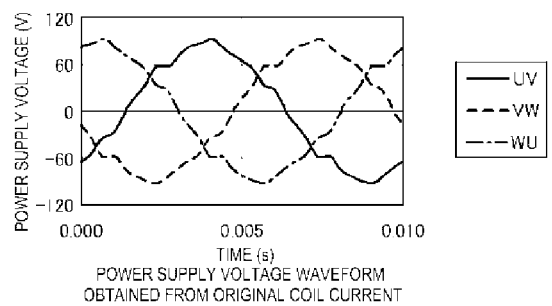

Next, a method for rapidly obtaining a steady coil current waveform by using a method for analyzing a circuit coupled magnetic field of the invention will be described with reference to FIG. 9. As illustrated in FIG. 9A, the invention differs from the method of the related art in that the invention starts from waveforms of basic sine waves of three-phase coil currents determined by design specifications. As will be described later, when the power supply voltage waveform is used as a reference, the coil current waveform is slightly distorted from this waveform of the basic sine wave. In the method of the invention, a power supply voltage waveform as illustrated in FIG. 9B is directly determined from an original coil current waveform. As can be seen from FIG. 9B, at this time, the power supply voltage waveform is not a clean sine wave, but contains a harmonic component due to non-linear magnetic characteristics of a magnetic material constituting the motor.

Next, the harmonic component is removed from the power supply voltage waveform of FIG. 9B to extract a basic sine wave voltage component. A result thereof is illustrated in FIG. 9C.

Figure 9C:
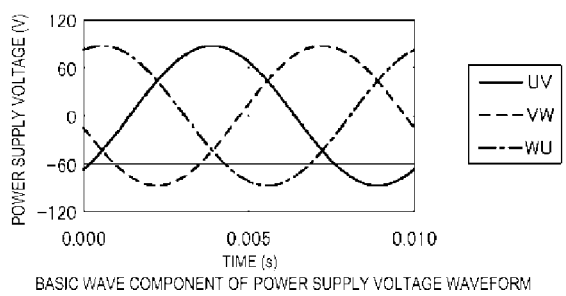
Figure 9D:
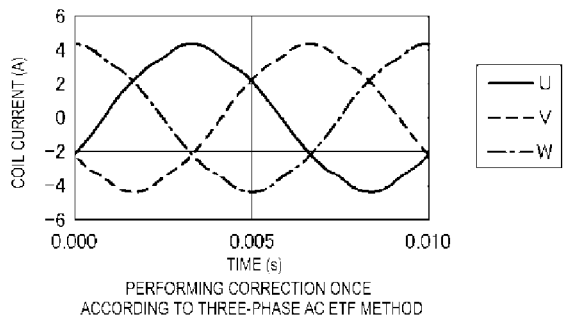

Finally, a circuit coupled magnetic field analysis is performed by using the basic sine wave voltage component of the power supply voltage waveform illustrated in FIG. 9C. Since the power supply voltage waveforms illustrated in FIGS. 9B and 9C are similar to each other, the coil current waveform obtained by this circuit coupled magnetic field analysis is similar to the original coil current waveform illustrated in FIG. 9A. For this reason, in this circuit coupled magnetic field analysis, an initial value of the original coil current waveform illustrated in FIG. 9A is used as an initial value of a coil current of the motor coil 101, so that a waveform similar to the steady waveform can be formed at an initial stage of the transient analysis. When a more high-accurate steady field is desired to be obtained, a three-phase AC error-correction time-interval flexible (ETF) method is further used for correction once, such that a steady coil current waveform is obtained from initial few steps as illustrated in FIG. 9D (from the second step in FIG. 9D).

Compared with the method of the related art illustrated in FIG. 8, in the circuit coupled magnetic field analysis according to the invention illustrated in FIG. 9, it can be seen that the coil current is instantly in the steady state. That is, as compared with the method of the related art illustrated in FIG. 8, when the method of the invention is used, the number of time steps of the transient analysis until reaching the steady state is greatly reduced.

<Description of Circuit Coupled Magnetic Field Analysis Based on Circuit Equation>

An outline of the principle of the method for analyzing the circuit coupled magnetic field of the invention is described above, but the invention is characterized in that an initial value of the coil current waveform is input firstly and a normal magnetic field analysis is performed. A circuit system is configured with a plurality of basic loops according to circuit theory. For example, in an example of FIG. 7, the following three basic loops are formed.

(a) basic loop of motor coil U→resistor R→inductance L→power supply WU→inductance L→resistor R→motor coil W.
(b) basic loop of motor coil U→resistor R→inductance L→power supply UV→inductance L→resistor R→motor coil V.
(c) basic loop of motor coil V→resistor R→inductance L→power supply VW→inductance L→resistor R→motor coil W.

Therefore, currents flowing through the circuit is formed of a plurality of basic loop currents $I_k^{loop}$ (k=1 to n, but here n=3), and a power supply voltage can be expressed by a plurality of basic loop voltages $V_k^{loop}$. The basic loop voltage $V_k^{loop}$ is obtained by the following equation using the basic loop current $I_k^{loop}$.

[Equation 1]

$$V_k^{loop} = \sum_j X_{jk} \frac{da_j}{dt} + \sum_{k'} R_{kk'} J_{k'}^{loop} + \sum_{k'} \overline{L}_{kk'} \frac{dI_{k'}^{loop}}{dt} \quad (1)$$

[Equation 2]

$$R_{kk'} = \sum_j T_{ik} R_j T_{ik'}, \quad \overline{L}_{kk'} = \sum_i T_{jk} L_i T_{ik'} \quad (2)$$

[Equation 3]

$$X_{jk} = \sum_p W_{jp} T_{pk}, \quad W_{jp} = \int N_j \cdot n_p dV \quad (3)$$

Here, a first term on a right side of the equation (1) is a plurality of coil induced voltage terms in a basic loop k, and a second term is a voltage drop quantity caused by a plurality of resistors in the basic loop k. Further, a third term is a voltage drop quantity caused by a plurality of inductances in the basic loop k. In a circuit coupled magnetic field analysis of a three-phase AC synchronous motor as illustrated in FIG. 7, k is 1 to 3.

In addition, $a_j$ in the equation (1) is an unknown variable related to magnetic vector potential assigned to an edge j of a finite element region. $R_k$ and $L_k$ in the equation (2) are a k-th resistor and inductance on the circuit, and $T_{ik}$ is a matrix connecting a current $I_i$ flowing through an i-th circuit element and a k-th basic loop current $I_k^{loop}$, and a matrix component has a value of "+1", "−1" or "0".

Further, $N_j$ in the equation (3) is an edge element vector basis function for the edge j in the finite element region, and $n_p$ is a unit vector indicating a direction of a current of a p-th coil. The current $I_i$ flowing through the i-th circuit element can be expressed by the following equation (4).

[Equation 4]

$$I_i = \sum_k T_{ik} I_k^{Loop} \quad (4)$$

If there is only one power supply in the basic loop k, the basic loop voltage $V_k^{loop}$ is the power supply voltage itself, and if there is a plurality of power supplies, the basic loop voltage $V_k^{loop}$ is a total amount with the direction being considered.

According to a circuit configuration illustrated in FIG. 7, since one power supply among the power supplies 200 (WU, VW, UV) respectively corresponds to a power supply of each basic loop, the power supply voltage is directly calculated based on the basic loop voltage.

However, when there is no neutral point connection line in a Y connection of the three-phase AC power supply system, two power supplies exist on the basic loop. However, in this case, if a total voltage of the three-phase AC power supply can be regarded as zero, the voltage of each power supply can be calculated based on the basic loop voltage by using this conditional equation.

The equation (1) is an equation using the basic loop current on the circuit, but the coupled magnetic field analysis of the invention is not limited to this equation, and may be a circuit equation using potentials at each point on the circuit. A point of the invention lies in calculating the power supply voltage waveform based on the coil current waveform by solving the circuit equation, and does not limit a type of the used circuit equation.

Further, amplitude and an initial phase of a basic waveform component are extracted from the power supply voltage waveform obtained by the above equation, and an ordinary magnetic field analysis is performed by using these as main components of an input voltage waveform of the circuit coupled magnetic field analysis. At this time, the above-described initial value of the coil current waveform is used as an initial value of the magnetic field analysis.

As described with reference to FIG. 9, in this case, the obtained coil current waveform is similar to the original coil current waveform. Therefore, since the circuit coupled magnetic field analysis starts from the initial value of the coil current waveform that is similar to a steady-state solution, convergence to the steady-state solution becomes faster, and the analysis time until reaching the steady-state solution can be greatly reduced.

Further, after performing the transient analysis of at least two time steps, the correction may be performed once by the three-phase AC ETF method. Here, the time step means one step in a time axis division in the transient analysis.

Further, in a program related to a method for calculating the power supply voltage waveform and a program related to the circuit coupled magnetic field analysis according to the invention, the above series of process is coded.

Hereinafter, embodiments of the invention will be described in detail with reference to FIGS. 1 to 6.

<Description of First Embodiment>

FIG. 1 is a flowchart illustrating a process of an analysis according to the first embodiment of the invention.

As illustrated in FIG. 1, first, an input data file 10 including discretized data 11 (mesh data) for numerically solving a differential equation and control data 12 (including coil current waveform data) for controlling an analysis process is read by a computer (steps S13 and S14).

Here, the discretized data 11 (mesh data) is data obtained by decomposing a structure (here, referred to as the synchronous motor 100 in the magnetic field analysis region illustrated in FIG. 7) into a plurality of finite elements (mesh). Since equations in an analysis space generally cannot be solved continuously, a method referred to as a finite element method (FEM), in which an analysis space is divided into meshes to solve the equations, is used. That is, the finite element method is a method for performing a numerical analysis by dividing the analysis space, and accuracy of the analysis increases as the mesh becomes finer. The control data 12 is input data related to analysis conditions. This control data includes data of the initial value of the coil current waveform.

These pieces of input data are supplied to an analysis execution module 20. The analysis execution module 20 uses these pieces of input data to execute a transient magnetic field analysis in which the coil current waveform is used as a given condition (step S21).

Next, a process for obtaining all basic loop voltage waveforms is executed by substituting a value of the unknown variable $a_j$ obtained for each time step into equation (1) (step S22). Then, the power supply voltage waveform is calculated based on the obtained basic loop voltage waveform (step S23). Thereafter, the obtained power supply voltage waveform is stored in a storage device 3 (see FIG. 4) (step S31), and this power supply voltage waveform is displayed on a display device 2 (see FIG. 4) (step S32).

According to the above-described first embodiment, the power supply voltage waveform can be directly calculated based on the initial value of the coil current waveform input as the control data, and the power supply voltage waveform can be displayed on the display device 2, so that the user can directly grasp the power supply voltage waveform.

<Description of Second Embodiment>

Hereinafter, the second embodiment of the invention will be described with reference to FIG. 2. In FIG. 2, processing up to step S23, which is the process for calculating the power supply voltage waveform, is the same as that of the first embodiment, and therefore the description is omitted.

In the second embodiment, a basic sine wave voltage component is calculated based on the power supply voltage waveform obtained in step S23 (step S24). The basic sine wave voltage component can be easily calculated by removing harmonics from the power supply voltage waveform obtained in step S23. The power supply voltage waveform obtained in step S23 and the basic sine wave voltage component obtained in step S24 are stored in the storage device 3 (step 31), and are displayed on the display device 2 (step S32).

According to the second embodiment of the invention, the basic sine wave voltage component is calculated based on the power supply voltage waveform calculated based on a coil current waveform input in an initial stage, and the basic sine wave voltage component is displayed together with the power supply voltage waveform on the display device 2, so that the user can directly grasp both the power supply voltage waveform and the basic sine wave voltage component.

<Description of Third Embodiment>

Hereinafter, the third embodiment of the invention will be described with reference to an analysis process of FIG. 3. Also, in the third embodiment, the steps up to step S23 for calculating the power supply voltage waveform are the same as those in the first or second embodiment, and therefore the description thereof is omitted.

In the third embodiment, a pulse width modulation (PWM) voltage waveform is calculated based on a power supply voltage waveform obtained in step S23 (step S25). Then, the power supply voltage waveform obtained in step S23 and the PWM voltage waveform obtained in step S25 are stored in the storage device 3 (step S31), and the power supply voltage waveform and the PWM voltage waveform are displayed on the display device 2 (step S32).

In the third embodiment, subsequent analysis is performed by using the PWM voltage waveform instead of the basic sine wave voltage waveform of the power supply voltage waveform. For example, the PWM voltage waveform can be made by using a carrier wave of several kHz to 20 kHz. When the PWM voltage waveform is used, switching control can be performed by repeating ON and OFF, so that although some noise is generated, there is a merit that it is easier to control the number of rotations of the motor as compared with driving by the basic sine wave voltage with a fixed frequency.

FIG. 4 illustrates an example of an analysis system for implementing the first to third embodiments of the invention.

As illustrated in FIG. 4, the analysis system according to the first to third embodiments of the invention includes a computer 1, the display device 2, the storage device 3 and an input device 4.

In FIG. 4, the storage device 3 is provided out of the computer 1 to clearly indicate the storage device 3, and may be installed inside the computer 1. The computer 1 stores a program based on at least one algorithm among the analysis processes of the first to third embodiments.

The input device 4 is, for example, a keyboard or a mouse. From the input device 4, input data including the above-described mesh data of the magnetic field analysis region and the control data necessary for other operations is input. When the input data is input, the computer 1 reads the input data and executes arithmetic processing related to the mesh data according to the stored program. Then, a processing result is displayed on the display device 2, or the processing result is stored in the storage device 3 as a data file. Note that not all of the obtained processing results, but some of them may be displayed or stored.

<Description of Fourth Embodiment>

Hereinafter, the fourth embodiment of the invention will be described with reference to an analysis process illustrated in FIG. 5. As illustrated in FIG. 5, processing up to step S24, which is the process for calculating the basic sine wave voltage component based on the power supply voltage waveform, is the same as that of the second embodiment, and therefore the description is omitted.

A basic sine wave voltage component of the power supply voltage waveform obtained in step S24 is input to the computer 1 (FIG. 4) as the power supply voltage waveform (step S41). The computer 1 executes the circuit coupled magnetic field analysis by using the initial value of the coil current waveform input as the control data as the initial value of the coil current (unknown variable) to be obtained from this (step S42).

Then, motor characteristic data such as the coil current waveform obtained in step S42 and a torque waveform is stored in the storage device 3 (step S31). The motor characteristic data such as the coil current waveform and the torque waveform is displayed on the display device 2 (Step S32).

Here, since the basic sine wave voltage component of the power supply voltage waveform obtained in step S24 generally has a waveform similar with the power supply voltage waveform, the coil current waveform obtained by the circuit coupled magnetic field analysis also has a waveform similar with the initial value of the coil current input as the control data 12 used in step S14.

For this reason, according to the fourth embodiment of the invention, in step S42, the coil current, which is an unknown variable, starts from an approximate initial value of the coil current to be capable of executing the circuit coupled magnetic field analysis, so that a quasi steady-state solution can be obtained much faster than the method of the related art.

<Description of Fifth Embodiment>

Hereinafter, the fifth embodiment of the invention will be described with reference to FIG. 6.

In the fifth embodiment, up to process S41, which is the process of inputting the basic sine wave voltage component of the power supply voltage waveform as the power supply voltage waveform, is same as that of the fourth embodiment, and thus the description thereof is omitted.

As described above, in step S42, the circuit coupled magnetic field analysis is performed by using the initial value of the coil current waveform included in the control data as the initial value, which is an unknown variable to be obtained, of the coil current. In step S42, in a time step 1 and a time step 2, a usual circuit coupled magnetic field analysis is performed. At an end stage of the time step 2 in the circuit coupled magnetic field analysis, the three-phase component (typically, three-phase coil linkage flux) whose time differential term is involved in the analysis is corrected by the three-phase AC ETF method described later (step S43).

Figure 10A:
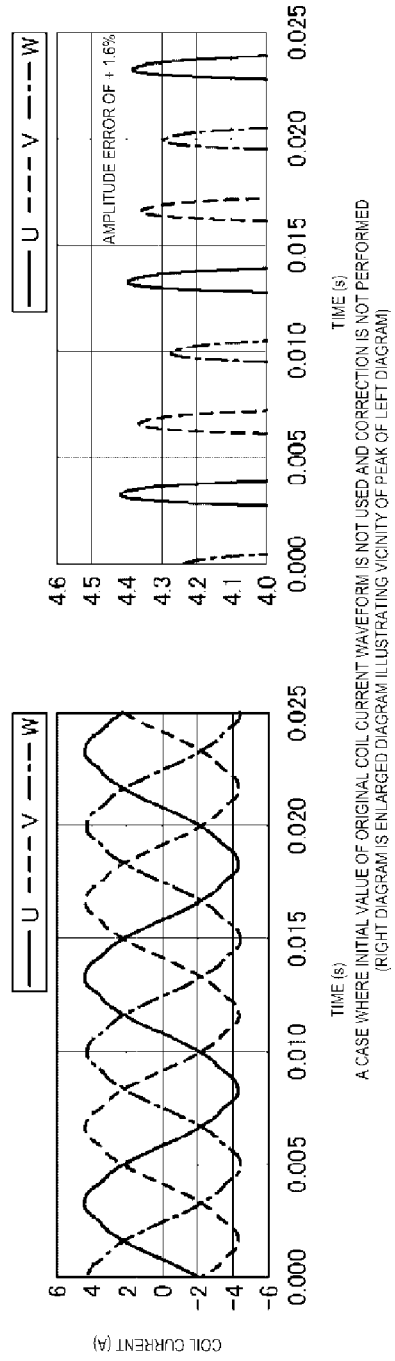
FIG. 10 is a waveform chart illustrating a difference between a coil current waveform obtained from a circuit coupled magnetic field analysis in which correction in the fifth embodiment is performed once and a coil current waveform in which no correction is performed.
Figure 10B:
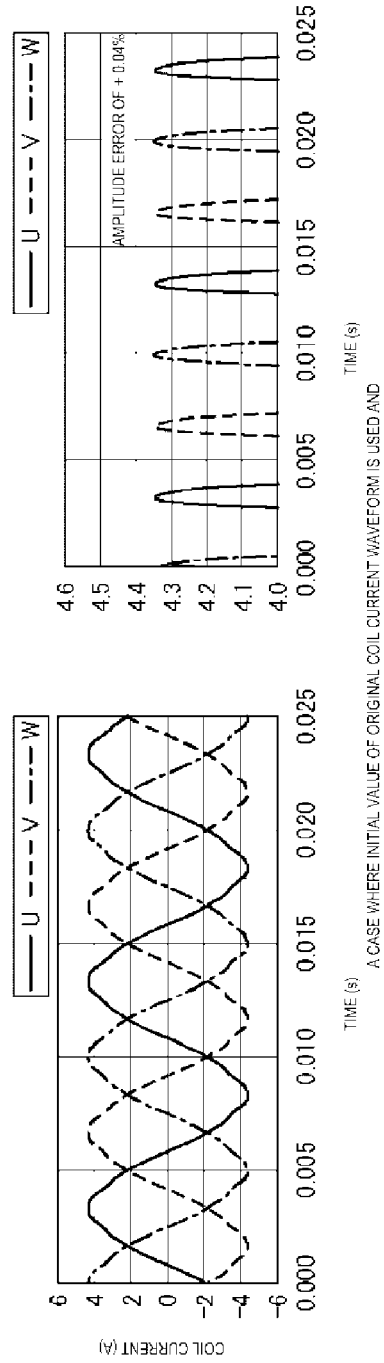

FIG. 10 is a diagram illustrating an analysis result of the fifth embodiment. FIG. 10A is an example in which the correction is not performed in step S43 in FIG. 6, and FIG. 10B is an example in which the correction is performed once by the three-phase AC ETF method after the analysis of the second time step is completed in step S43.

As illustrated in the left diagram of FIG. 10A, when the initial value of the original coil current waveform is used, since the initial value is started from an initial value similar to the steady-state solution, a coil current waveform almost similar to the steady-state solution can be obtained in an early stage without the correction.

A diagram on a right side of FIG. 10 is an enlarged diagram illustrating a vicinity of a peak of the waveform diagram on a left side of FIG. 10. As can be seen from the diagram on the right side of FIG. 10A, without the correction in step S43, amplitude error of the three-phase coil current is ±1.6%. On the other hand, as illustrated in the diagram on the right side of FIG. 10B, it can be seen that when the correction is performed once by the three-phase AC ETF method, the amplitude error of the coil current becomes±0.04% and a more high-accurate steady-state solution can be obtained.

<Description of Three-Phase AC ETF Method>

The three-phase AC ETF method is a method already disclosed in JP-A-2014-142701, entitled "analysis method of time period nonlinear field and analysis program of time period nonlinear field", and specifically, a correction represented by the following equations is performed.

[Equation 5]
$$U_{new} = \alpha(dU + dV + dW) + \beta dV + \gamma dW \quad (5)$$

[Equation 6]
$$V_{new} = \alpha(dU + dV + dW) + \beta dW + \gamma dU \quad (6)$$

[Equation 7]
$$W_{new} = \alpha(dU + dV + dW) + \beta dU + \gamma dV \quad (7)$$

[Equation 8]
$$\beta = -\frac{1}{2} + \frac{\sin d\theta}{2\sqrt{3}(1-\cos d\theta)} \quad (8)$$

[Equation 9]
$$\gamma = -\frac{1}{2} - \frac{\sin d\theta}{2\sqrt{3}(1-\cos d\theta)} \quad (9)$$

Here, symbols U, V and W are quantities meaning three-phase components to be corrected, and $U_{new}$, $V_{new}$ and, $W_{new}$ are values of U, V and W after the correction. dU, dV, and dW are respectively variation amounts of U, V and, W from the time step 1 to the time step 2. Further, $d\theta$ is a time step width expressed in an electrical angle. Note that a may be any value, but a value of ½ is usually used.

Hereinafter, the first to fifth embodiments of the invention are described above in order. The examples described here are merely examples of the embodiments, and the invention is not limited thereto. The invention naturally includes other applied examples and modifications without departing from the contents described in claims.

DESCRIPTION OF REFERENCE NUMERALS

1 computer, 2 display device, 3 storage medium, 4 input device, 10 input data file, 11 discretized data, 12 control data, 20 analysis process, 100 magnetic field analysis region including synchronous motor, 101 motor coil, 200 power supply

The invention claimed is:

1. A method for driving an electromagnetic device, the method comprising:
   a step of reading, into a computer, input data including discretized data for numerically solving a differential equation, and control data for controlling an analysis process in which coil current waveform data is included;
   a step of obtaining, by one or more processors, a coil induced voltage waveform by performing a transient magnetic field analysis, wherein the coil current waveform data is taken as a given condition by using the input data;
   a step of calculating, by the one or more processors, a basic loop voltage waveform in a power supply unit based on the coil induced voltage waveform and the coil current waveform data used as the input data by using a circuit equation in a power supply circuit;
   a step of obtaining, by the one or more processors, a power supply voltage waveform based on the basic loop voltage waveform; and
   a step of driving the electromagnetic device in accordance with the obtained power supply voltage waveform.

2. The method for driving an electromagnetic device according to claim 1, the method further comprising:

a step of storing the power supply voltage waveform, which is a calculated analysis result, in a storage device; and a step of displaying the analysis result on a display device.

3. The method for driving an electromagnetic device according to claim 2, the method further comprising:

a step of calculating a power supply voltage basic sine wave voltage component based on the power supply voltage waveform.

4. The method for driving an electromagnetic device according to claim 2, the method further comprising:

a step of calculating a PWM voltage waveform based on the power supply voltage waveform.

5. The method for driving an electromagnetic device according to claim 1, the method further comprising:

a step of calculating a power supply voltage basic sine wave voltage component based on the power supply voltage waveform.

6. The method for driving an electromagnetic device according to claim 1, the method further comprising:

a step of calculating a PWM voltage waveform based on the power supply voltage waveform.

* * * * *